(12) United States Patent
Rathburn

(10) Patent No.: US 6,572,396 B1
(45) Date of Patent: Jun. 3, 2003

(54) LOW OR ZERO INSERTION FORCE CONNECTOR FOR PRINTED CIRCUIT BOARDS AND ELECTRICAL DEVICES

(75) Inventor: James J. Rathburn, Greenfield, MN (US)

(73) Assignee: Gryphics, Inc., Plymouth, MN (US)

( * ) Notice: Subject to any disclaimer, the term of this patent is extended or adjusted under 35 U.S.C. 154(b) by 0 days.

(21) Appl. No.: 09/890,008

(22) PCT Filed: Feb. 2, 2000

(86) PCT No.: PCT/US00/02641

§ 371 (c)(1),
(2), (4) Date: Jul. 25, 2001

(87) PCT Pub. No.: WO00/46885

PCT Pub. Date: Aug. 10, 2000

Related U.S. Application Data

(60) Provisional application No. 60/118,307, filed on Feb. 2, 1999.

(51) Int. Cl.[7] ............................................. H01R 9/09
(52) U.S. Cl. ...................................... 439/260; 439/66
(58) Field of Search ........................ 439/66, 62, 67, 439/71, 77, 260, 65, 91

(56) References Cited

U.S. PATENT DOCUMENTS

| | | |
|---|---|---|
| 4,118,090 A | 10/1978 | Del Mei |
| 4,161,346 A | 7/1979 | Cherian et al. |
| 4,165,909 A | 8/1979 | Yeager et al. |

(List continued on next page.)

FOREIGN PATENT DOCUMENTS

| | | |
|---|---|---|
| EP | 0 310 302 | 4/1989 |
| EP | 0 351 851 | 1/1990 |
| EP | 0405333 A2 | 1/1991 |
| EP | 0431566 A | 6/1991 |
| EP | 0 574 793 | 12/1993 |
| EP | 0817319 A2 | 1/1998 |
| GB | 1 488 328 | 10/1977 |
| GB | 2 027 560 | 2/1980 |
| WO | 98/13695 | 4/1998 |
| WO | WO 98/50985 | 11/1998 |
| WO | 00/46885 | 8/2000 |
| WO | 01/09980 A3 | 2/2001 |
| WO | 01/54232 A2 | 7/2001 |

OTHER PUBLICATIONS

PCT/US 00/02641 International Search Report.

*Primary Examiner*—P. Austin Bradley
*Assistant Examiner*—Alexander Gilman
(74) *Attorney, Agent, or Firm*—Faegre & Benson LLP

(57) ABSTRACT

A connector apparatus including a connector housing having one or more apertures. One or more contact members are positioned within each of the apertures. Each contact member has a first interface portion adjacent to a receiving opening and a second interface portion. The contact members are moveable between an engaged and a disengaged position within the receiving opening. A first compliant material retains the contact members to the connector housing. A second compliant material is positioned to bias the contact members toward the engaged position. An actuator is releasably engaged with the housing. The contact members are biased toward the engaged position when the actuator is engaged with the housing.

41 Claims, 11 Drawing Sheets

U.S. PATENT DOCUMENTS

| | | | |
|---|---|---|---|
| 4,189,200 A | 2/1980 | Yeager et al. | |
| 4,445,735 A | 5/1984 | Bonnefoy | |
| 4,468,074 A | 8/1984 | Gordon | 339/75 |
| 4,498,722 A | 2/1985 | Fedder et al. | |
| 4,509,099 A | 4/1985 | Takamatsu et al. | |
| 4,548,451 A | 10/1985 | Benarr et al. | |
| 4,575,170 A | 3/1986 | Gurley | |
| 4,579,411 A | 4/1986 | Cobaugh et al. | |
| 4,593,961 A | 6/1986 | Cosmo | 339/61 |
| 4,603,928 A | 8/1986 | Evans | |
| 4,610,495 A | 9/1986 | Landi | |
| 4,629,270 A | 12/1986 | Andrews, Jr. et al. | |
| 4,648,668 A | 3/1987 | Sinisi | |
| 4,655,524 A | 4/1987 | Etzel | |
| 4,691,972 A | 9/1987 | Gordon | |
| 4,758,176 A | 7/1988 | Abe et al. | |
| 4,768,971 A | 9/1988 | Simpson | |
| 4,789,345 A | 12/1988 | Carter | |
| 4,793,814 A | 12/1988 | Zifcak et al. | |
| 4,872,853 A | 10/1989 | Webster | |
| 4,904,197 A | 2/1990 | Cabourne | |
| 4,913,656 A | 4/1990 | Gordon et al. | |
| 4,927,369 A | 5/1990 | Grabbe et al. | |
| 5,007,842 A | 4/1991 | Deak et al. | |
| 5,049,084 A | 9/1991 | Bakke | |
| 5,061,192 A | 10/1991 | Chapin et al. | |
| 5,071,359 A | 12/1991 | Arnio et al. | |
| 5,096,426 A | 3/1992 | Simpson et al. | |
| 5,156,553 A * | 10/1992 | Katsumata et al. | 439/62 |
| 5,163,834 A | 11/1992 | Chapin et al. | |
| 5,167,512 A | 12/1992 | Walkup | |
| 5,173,055 A | 12/1992 | Grabbe | 439/66 |
| 5,199,889 A | 4/1993 | McDevitt, Jr. | |
| 5,207,585 A | 5/1993 | Byrnes et al. | |
| 5,227,959 A | 7/1993 | Rubinstein et al. | |
| 5,252,916 A | 10/1993 | Swart | |
| 5,299,090 A | 3/1994 | Brady et al. | |
| 5,324,205 A | 6/1994 | Ahmad et al. | |
| 5,338,207 A | 8/1994 | Lineberry et al. | |
| 5,342,205 A | 8/1994 | Hashiguchi | |
| 5,395,252 A | 3/1995 | White | |
| 5,410,260 A | 4/1995 | Kazama | |
| 5,412,329 A | 5/1995 | Iino et al. | |
| 5,427,535 A | 6/1995 | Sinclar | |
| 5,437,556 A | 8/1995 | Bargain et al. | |
| 5,521,519 A | 5/1996 | Faure et al. | |
| 5,637,539 A | 6/1997 | Hofmann et al. | |
| 5,645,433 A | 7/1997 | Johnson | |
| 5,653,598 A | 8/1997 | Grabbe | |
| 5,723,347 A | 3/1998 | Hirano et al. | |
| 5,795,172 A | 8/1998 | Shahriari et al. | |
| 5,893,761 A * | 4/1999 | Longueville | 439/66 |
| 5,913,687 A | 6/1999 | Rathburn | |
| 5,919,050 A * | 7/1999 | Kehley et al. | 43/71 |
| 5,920,765 A | 7/1999 | Naum et al. | |
| 5,923,178 A | 7/1999 | Higgins et al. | |
| 5,938,451 A | 8/1999 | Rathburn | 439/66 |
| 5,947,749 A | 9/1999 | Rathburn | |
| 5,984,691 A | 11/1999 | Brodsky et al. | |
| 6,004,151 A * | 12/1999 | Hashigushi | 439/260 |
| 6,079,987 A | 6/2000 | Matsunaga et al. | |
| 6,135,783 A | 10/2000 | Rathburn | |
| 6,178,629 B1 | 1/2001 | Rathburn | |
| 6,231,353 B1 | 5/2001 | Rathburn | |
| 6,247,938 B1 | 6/2001 | Rathburn | |

\* cited by examiner

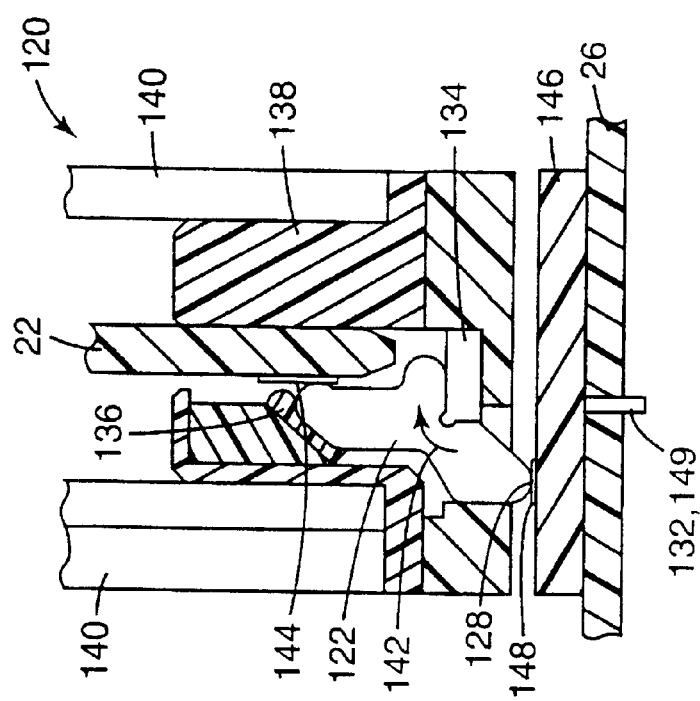
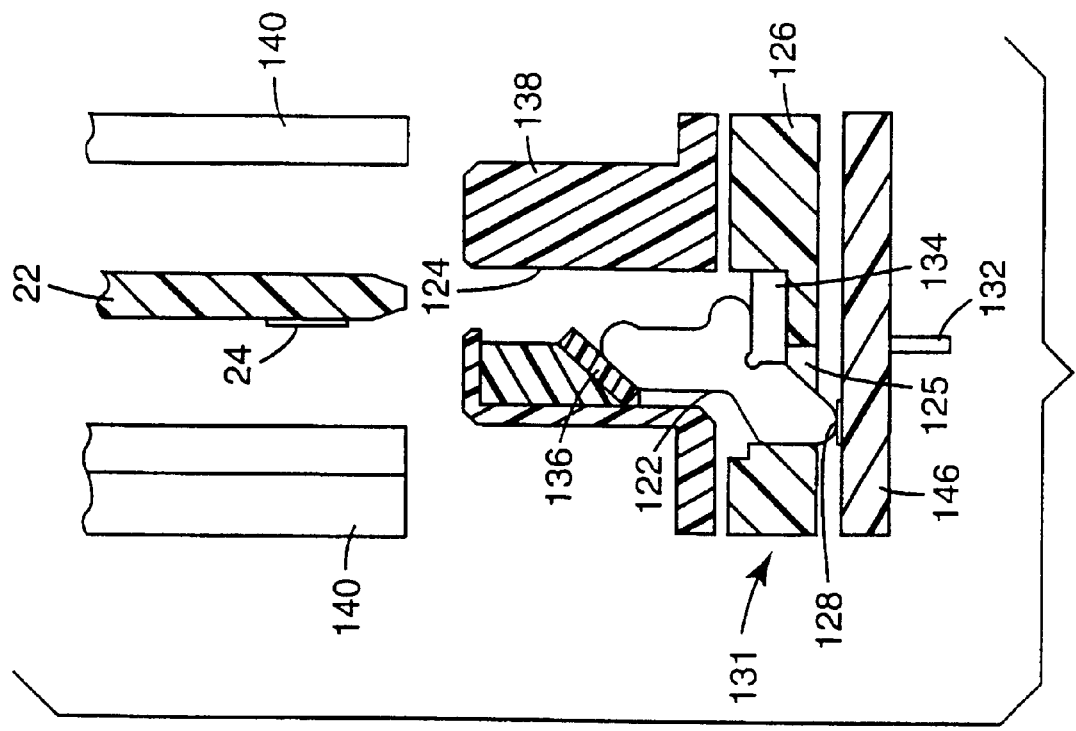
Fig. 5
Fig. 4

US 6,572,396 B1

LOW OR ZERO INSERTION FORCE CONNECTOR FOR PRINTED CIRCUIT BOARDS AND ELECTRICAL DEVICES

The present application claims the benefit of U.S. Provisional Application No. 60/118,307, filed Feb. 2, 1999.

FIELD OF THE INVENTION

The present invention is directed to a low insertion force or zero insertion force connector for printed circuit boards and integrated circuit devices.

BACKGROUND OF THE INVENTION

The printed circuit boards typically have one or more rows of conductive pads located along an edge of the board. The conductive pads are typically spaced between 0.010 to about 0.025 inches apart. The conductive pads are electrically connected to the integrated circuit packages by routing layers or traces on the printed circuit board. The edge of the board and the surface pads can be plugged into a corresponding connector within a larger assembly. The integrated circuits are coupled to the larger assembly through the routing layers, the conductive pads and the connector. The connectors are commonly referred to as card edge connectors.

The printed circuit board assemblies are typically tested in a test fixture after the integrated circuit packages have been soldered to the board. The tester may have a card edge connector that is mounted on a test board. The circuit board assembly is tested by manually pushing the board into the card edge connector.

Card edge connectors typically have a plurality of spring like contacts, which are pressed into the conductive pads. To plug in a board, the operator must exert enough force to overcome the spring force of the contacts. A production facility may produce thousands or millions of printed circuit boards, which must be plugged into the test connector. The repetitiveness of inserting so many circuit boards into the test connector may cause the card edge connector contacts to wear out. Eventually, the card edge connector will need to be replaced. The contacts on the connector can also scar the conductive pads on the printed circuit board.

Many of the same difficulties associated with testing printed circuit boards also arise in the testing of integrated circuit devices. In addition to the problems described above, the leads on integrated circuit devices can be easily damaged during insertion into and removal from a test fixture.

WO 98/50985 discloses a multi-mode compliant connector for various circuit devices. U.S. Pat. No. 4,593,961 discloses an electrical compression connector.

Low insertion force or zero insertion force connectors are preferred in those instances where it is desired to minimize wear on the contacts and to minimize damage to the printed circuit board conductive pads or leads on an integrated circuit device.

SUMMARY OF THE INVENTION

The present invention relates to a connector for electrically connecting integrated circuit devices or printed circuit boards to a second circuit member. The second circuit member may be a motherboard, back plane, or the like. The present invention interfaces with the same conductive pads as a traditional edge card connector. The conductive pads may be located on one or both side of the printed circuit board, and can be in a single row or multiple levels of rows.

In one embodiment, the connector apparatus comprises a connector housing having one or more apertures. One or more contact members are positioned within each of the apertures. Each contact member has a first interface portion adjacent to a receiving opening in the housing and a second interface portion. The contact members are moveable between an engaged and a disengaged position within the receiving opening. A first compliant material retains the contact members to the connector housing. A second compliant material is positioned to bias the contact members toward the engaged position. An actuator is releasably engages with the housing. The contact members are biased toward the engaged position when the actuator is engaged with the housing.

In a zero insertion force embodiment, the contact members in the disengaged position provide no resistance to insertion of a first circuit member into the receiving opening. In a low insertion force embodiment, the contact members provide minimal resistance to insertion of the first circuit member into the receiving opening.

The contact members typically abut the connector housing in the disengaged position. The contact members pivot against the connector housing when moving between the disengaged position and the engaged position. The actuator typically includes an opening permitting a first circuit member to extend into the receiving opening.

The second compliant member can be attached to the actuator. In one embodiment, the first compliant material is positioned between the contact members and the connector housing and a second compliant material is positioned between the contact members and the actuator. The actuator is typically engaged with the housing in response to the first circuit member being inserted into the receiving opening.

The first compliant material has a Durometer greater than, less than, or equal to, a Durometer of the second compliant material. The contact members can include one or more recesses for receiving a portion of the first compliant material.

The contact members can be flexible or rigid. In an embodiment where the contact members are flexible, in the engaged position the first and second compliant members primarily provide the first mode of compliance and elastic deformation of the flexible contact members primarily provides the second mode of compliance.

The first circuit interface portion can optionally have a shape complementary to a shape of an electrical interface on a first circuit member. At least one support member can optionally support the contact member. The support member comprises a pivot point around which the contact members rotate. In one embodiment, the support member comprises a flexible filament capable of permitting translational and rotational movement of the contact members within the connector housing.

An adapter can optionally be interposed between the connector apparatus and a second circuit member. A base frame can optionally be attachable to the second circuit member. The connector housing, contact members and first compliant material comprise a removable contact set that can be easily replaced.

The present invention is also directed to a method of electrically connecting a first circuit member having a plurality of conductive pads to a second circuit member. One or more contact members are positioned within one or more apertures on a connector housing. Each contact member has a first interface portion adjacent to a receiving opening and a second interface portion. The contact members are moveable between an engaged and a disengaged position. A first compliant material is applied to retain the contact members to the connector housing. A connector housing is located on the second circuit member. An actuator is engaged with the housing to bias the contact members toward the engaged position. The step of inserting the first circuit member into the receiving opening can occur before or after the actuator is engaged with the housing. A second compliant member can be located between the actuator and the contact members.

The present connectors can be used in a test or burn-in environment for testing or exercising stand-along integrated circuit devices or printed circuit boards, whether bare boards or assembled units. The present connector is easy to use, has a long mechanical life and high electrical performance with minimal marking of the conductive pads or contact leads. The present connector may also be used in final assemblies.

BRIEF DESCRIPTION OF THE SEVERAL VIEW OF THE DRAWING

FIG. 4 is a side sectional view of an electrical connector in accordance with the present invention utilizing an adapter.

FIG. 5 is a side sectional view of the electrical connector of FIG. 4 engaged with a printed circuit board.

DETAILED DESCRIPTION OF THE INVENTION

Figure 1:
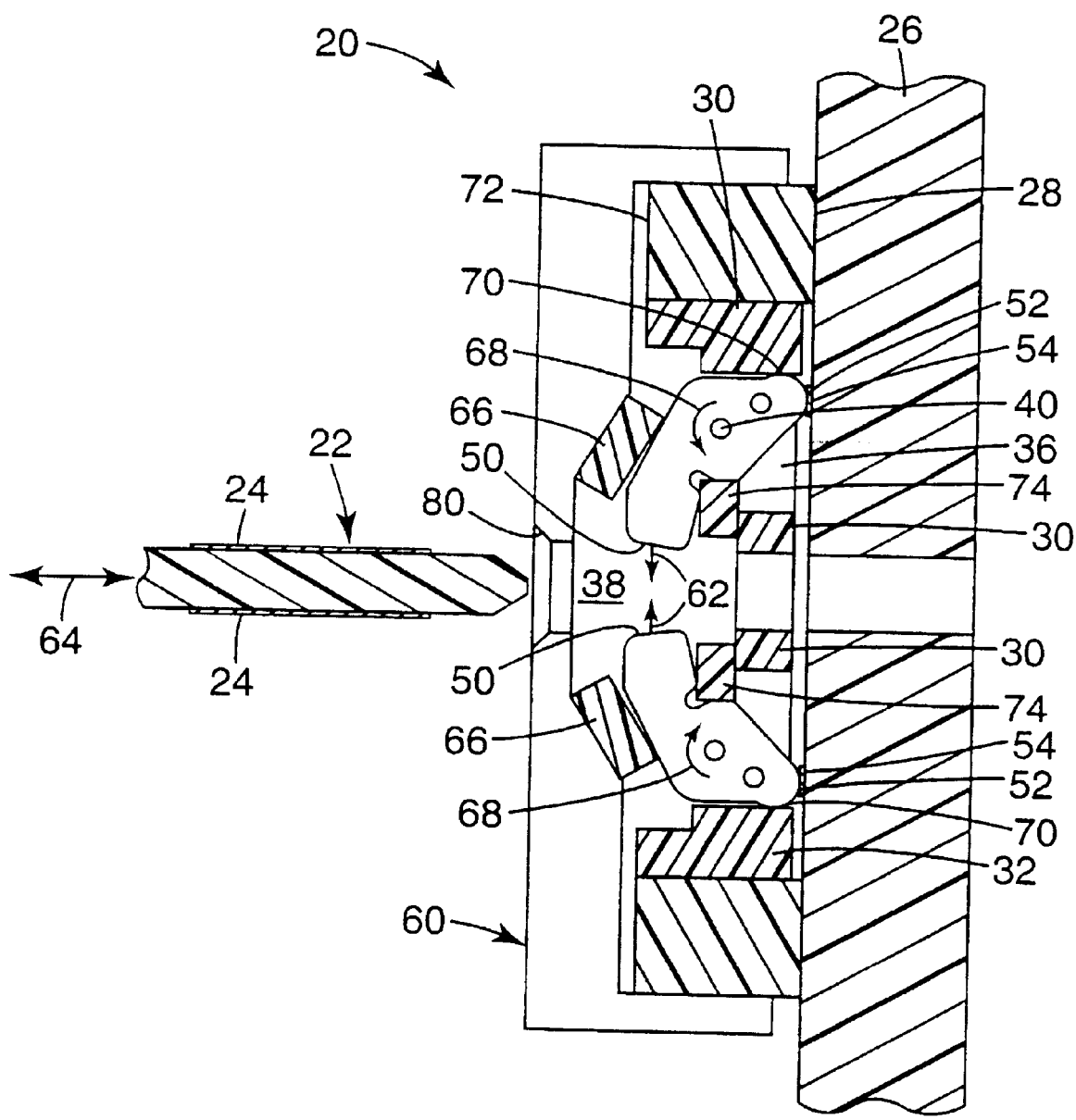
FIG. 1 is a side sectional view of an electrical connector in accordance with the present invention.
Figure 2:
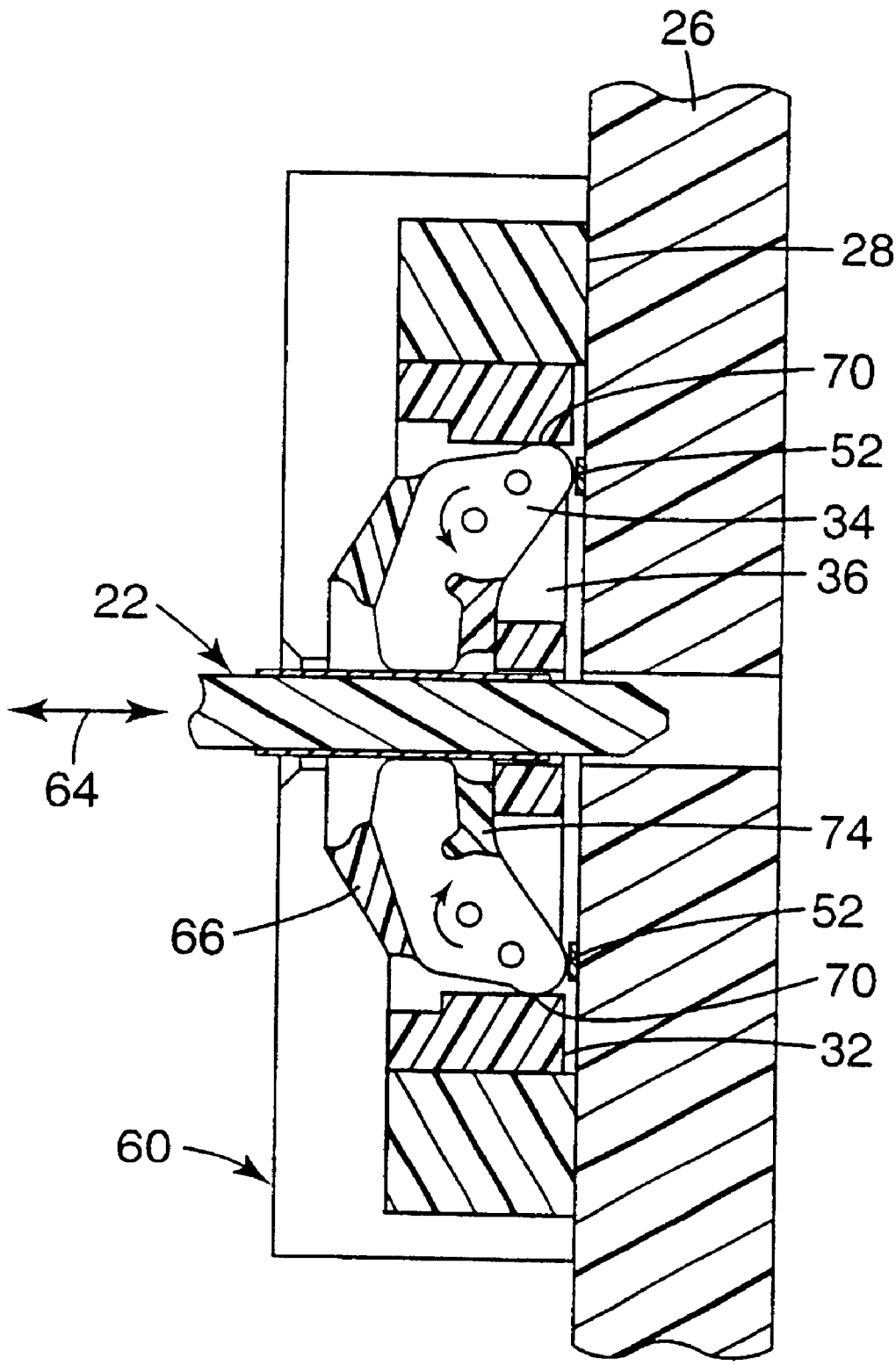
FIG. 2 is a side sectional view of the connector of FIG. 1 engaged with a printed circuit board.

FIGS. 1 and 2 are a side sectional view of a connector 20 for electrically connecting a printed circuit board 22 have a plurality of conductive pads 24 with a second circuit member 26. The second circuit member 26 may be another printed circuit board, a motherboard, a back plane, or the like. The connector 20 includes a base frame 28 positioned on the second circuit member 26 having a center opening 38 for receiving a contact set 32. The contact set 32 includes a plurality of contact members 34 retained in housing 30. The housing 30 can be removed from the base frame 28 to replace the contact set 32. In the illustrated embodiment, the contact members 34 are positioned on both sides of a printed circuit board receiving opening 38 to engage with the conductive pads 24 on both sides of the printed circuit board 22.

The contact members 34 are retained in the housing 30 by a compliant encapsulating material 36. The encapsulating material 36 allows vertical, lateral and/or rotational movement of the contact members 34 within the housing 30. The contact members 34 may also be retained in the housing 30 by a mechanical mechanism, such as support members 40. The support members 40 are preferably anchored to the housing 30. The support members 40 may be permanent or may be removed after application of the compliant encapsulant 36 The support members 40 may be a rigid or a flexible material. In the illustrated embodiment, the support members 40 are flexible, but not extendible, to permit translational and rotational movement of the contact members 34. Translational movement refers to movement having horizontal and/or vertical components. The contact members 30 can be retained in one or more apertures in the housing 30. In one embodiment, multiple contact members 34 separated by dielectric spacers are supported by support member 40 and located in a single aperture in the housing 30. Alternatively, each contact member 34 can be located in a separate aperture in the housing 30.

The housing 30 is preferably constructed of a dielectric material, such as plastic. Suitable plastics include phenolics, polyesters, 30% glass filled Ultem 2300 polymer material, and Ryton® available from Phillips Petroleum Company. Alternatively, the housing 30 can be constructed from a conductive material coated with a non-conductive material. Examples of suitable encapsulating materials include thermally conductive silicone based epoxy, Sylgard® available from Dow Corning Silicone of Midland, Mich. and Master Sil 713 available from Master Bond Silicone of Hackensack, N.J.

In the illustrated embodiment, the contact members 34 are rigid or semi-flexible. The contact members 34 have a shape that allows them to connect a horizontal printed circuit board with a vertical printed circuit board. The contact member 34 can be constructed of copper or similar metallic materials such as phosphor bronze or beryllium-copper. The contact members 34 may be plated with a corrosion resistant metallic material such as nickel, gold, silver, or palladium. Alternatively, the contact members 34 may be flexible. Other configurations for the connector members 34 are shown in U.S. Pat. No. 5,938,451 (Rathbum) entitled Replaceable Chip Module, filed Oct. 17, 1997; and U.S. Pat. No. 5,913,687 (Rathbum) entitled Electrical Connector with Multiple Modes of Compliance, filed on May 6, 1997.

The compliant encapsulant 36 can be such that a physical bond with the contact members 34 is formed. Alternatively, the compliant encapsulant 36 encompasses a portion of the contact members 34, but no bond is formed. In yet another embodiment, a bond is formed between the contact members 34 and the encapsulant 36, but that bond is broken when the connector apparatus 20 is actuated.

The contact members 34 have a first interface portion 50 positioned opposite the printed circuit board receiving opening 38. It is the first interface portion 50 that engages with the conductive pads 24 on the printed circuit board 22. The contact members 34 also include a second interface portion 52 positioned to engage with conductive pads 54 on the second circuit member 26. The interface of the contact members 34 with the pads 54 on the second circuit member 26 is generated without the use of solder.

FIG. 1 illustrates the contact members 34 in a disengaged position. An actuator 60 is positioned over the base frame 28 and contact set 32 for pivoting the contact members 34 in a direction 62 towards the center of the printed circuit board receiving opening 38. As the actuator 60 moves along an axis 64, compliant material 66 engages with the contact members 34 and causes them to rotate in the direction 68. As the contact members 34 rotate in the direction 68, edge portion 70 pivots against with the housing 30 to cause the first interface portions 50 to move towards the center of the printed circuit board receiving opening 38 to the engaged position (see FIG. 2).

The base frame 28 includes a stop surface 72 that limits travel of the actuator 60 along the axis 64. In the illustrated embodiment, compliant member 74 is interposed between a lower surface of the contact members 34 and the housing 30. In one embodiment, the compliant material 74 has a lower Durometer than the compliant material 66. The compliant material 66, 74 may be a variety of elastomeric compositions, such as silicone or urethane.

The connector 20 as described above consists of a contact set 32, either in a preloaded or suspended condition, or positioned within a second base frame 28. In one embodiment, the interface between the contact members 34 and the second circuit member 22 is facilitated by a compressive force applied as the housing 30 is mounted in the base frame 28. This type of interface results in the contact members 34 being maintained in a preloaded condition, before actuation of the connector 20.

In another embodiment, the contact set 32 is positioned on the second circuit number 26 by alignment pins, without the base frame 28. The use of alignment pins (see FIG. 4) or a base frame 28 provides alignment to ensure that the contact members 34 are aligned with the desired conductive pads, without shorting or misalignment. These structures also allow the contact members 34 to be essentially resting in a pre-actuated position without stress or force being applied to the contact members 34, the secondary compliant members 74, or the encapsulating material 36.

The contact set 32 is in principle resting suspended within the base frame 28 or positioned on corresponding pins. The contact set 32 can be easily removed from the second circuit member 26 since it is not soldered or rigidly mounted thereto. The function of the individual contact members 34 is enhanced by not being preloaded, allowing for the upper portion, lower portion or intermediate portion to be actuated simultaneously or in a desired sequence without having to overcome the force applied during pre-loading. This configuration also allows the connector 20 to apply force when needed, without constant stress on one or more of the components, thereby increasing the functional life of the assembly.

The contact members 34 may be physically positioned such that the printed circuit board 22 completely misses the first interface portions 50. If the contact members 34 are completely outside the path of the printed circuit board 22, the connector 20 is a zero insertion force connector since no force needs to be applied to the contact members 34 as the board 22 is inserted. The zero insertion force mode is typically achieved by positioning the printed circuit board 22 in the opening 38 and then engaging the actuator 60 with the contact set 32.

The low insertion force mode is typically achieved by fully or partially engaging the actuator 60 with the contact set 32 before the printed circuit board 22 is inserted. If the contact members 34 are in the path of the printed circuit board 22 by only a slight amount, the printed circuit board 22 may force the contact members 34 out of position as it encounters the first interface portions 50. As the printed circuit board is advanced into the opening 38, the resiliency of the compliant material 66 is overcome. If the interference between the printed circuit board 22 and the contact members 34 is slight and the force required is low, the connector 20 is a low insertion force connector. Finally, the contact members 34 can be positioned to require a high normal force to insert the printed circuit board 22 into the connector 20. Each of these styles of connector can be embodied in the present invention. The same analysis applies to use of the present connectors with an integrated circuit device (see FIGS. 13 and 14).

The actuator 60 provides several functions. First, the actuator 60 includes guide edges 80 that assist in aligning the printed circuit board 22 such that the conductive pads 24 encounter the contact members 34 in a lateral direction. The actuator 60 can also be configured such that it provides an interface to the contact members 34 in a direction opposite of the position of the conductive pads 24 on the printed circuit board 22. This interference can apply force against the contact members 34 to either cause movement in the desired direction or conversely restrict movement in a desired direction.

This interface can be achieved as the actuator 60 is installed, or the actuator 60 can remain in a free position. As discussed above, the actuator 60 causes the contact members 34 to move towards the corresponding pads 24 on the printed circuit board 22. The resultant vertical component of this force acts to ensure contact between the second interface portion 52 and the pads 54 on the second circuit member 26. In the illustrated embodiment, the actuator 60 also provides a downward force on the housing 30. As best illustrated in FIG. 2, the actuator 60 also causes the housing 30 of the contact set 32 to be flush with the stop surface 72.

The downward pressure provided by the actuator 60 serves to minimize variations in flatness or co-planarity of the contact members 34. The features on the underside of the actuator 60 which encounter the contact members 34 can be integral with the actuator 60, or they can be added as separate pieces or combinations of pieces to the connector 20. The features on the underside of the actuator 60 can be rigid, translating a high percentage of the downward force against the contact members 34. Alternatively, these features can be compliant in nature, such as the high Durometer compliant material 66, compensating for variations in position or force application. The use of compliant material 66 as the interface feature, which also allows for rearward movement of a contact members 34, while the actuator 66 is in place, such as in the case if the contact members 34 reside in the path of the printed circuit board 22 as it is inserted into the connector 20.

Several mounting or actuator retention options can be employed. The base frame 28 can be mounted with fasteners, adhesives, or with pins extending through the second circuit member 26. The base frame 28 can optionally contain features for retaining the actuator 60, such as spring loaded snap pins, fasteners, or latches. Alternatively, the actuator 60 can be retained with the same fasteners used to mount the base frame 28 to the second circuit member 26. When the actuator 60 is removed from the base frame 28, the compliant material 74 rotates the contact members 34 in a direction opposite to 68 so as to release the printed circuit board 22 from the connector 20.

Figure 3:
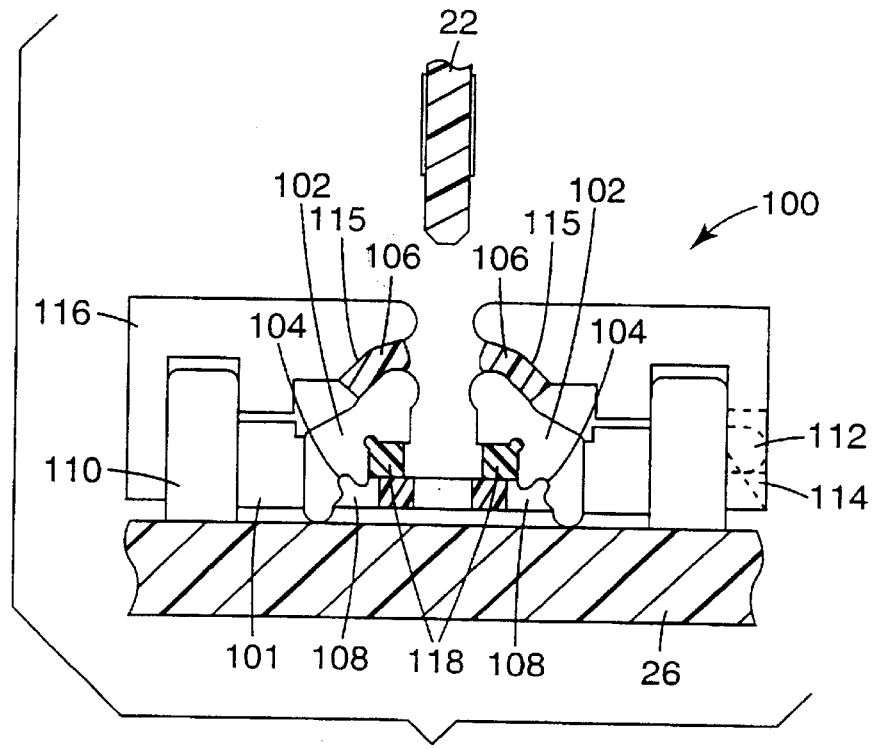
FIG. 3 is a side sectional view of an alternate electrical connector in accordance with the present invention.

FIG. 3 is a side sectional view of an alternate connector 100 in which the contact members 102 incorporate features 104 into which the encapsulating material 108 can flow. Additionally, feature 106 is provided on the contact members 102 for engagement with the compliant material 118. The features 104, 106 tailor or determine the physical reaction, compliance or retention of the contact members 102 within the housing 101. Base frame 110 includes a protrusion 112 that releasably engages with a slot 114 on the actuator 116. For zero insertion force applications, once the printed circuit board 22 is inserted into the connector 100, the actuator 116 can be latched in place using the protrusion 112 in the slot 114. Alternatively, in a low insertion force mode, the actuator 116 can be latched in place prior to insertion of the printed circuit board 22. In either event, the compliant material 115 moves the contact members 102 into the engaged position.

FIGS. 4 and 5 illustrate alternate connectors in accordance with the present invention in the disengaged and engaged positions, respectively. Rather than a pair of opposing contact members, such as illustrated in FIG. 1, the connector 120 of FIGS. 4 and 5 includes a single row of contact members 122 positioned opposite a support surface 124 that permits compressive engagement with the printed circuit board 22.

The contact set 131 includes a plurality of contact members 122 retained in housing 126 by an encapsulating material 125. The second interface portions 128 of the contact members 122 are positioned to engage with a conductive pad 148 on an adapter 146. The conductive pad 148 on the adapter 146 is electrically coupled to an alignment pin 132. The alignment pin 132 may be soldered or press-fit into a plated through hole 149 on the second circuit member 26. Each contact member 122 typically requires one or more alignment pin 132 for electrically coupling the connector 120 to the second circuit member 26. The contact set 131 can be removed from the adapter 146 and easily replaced when necessary.

A first compliant member 134 is interposed between the contact member 122 and the housing 126. Similarly, a second compliant member 136 is interposed between the contact member 122 and the actuator 138. In the illustrated embodiment the printed circuit board 22 is part of an assembly 141 having a set of actuators 140 which are arranged to engage with the actuator 138 as the printed circuit board 122 is inserted into the connector 120. As best illustrated in FIG. 5, as the actuators 140 and printed circuit board 22 are advanced toward the connector 120, the actuator 138 is compressed against the housing 126, causing the contact members 122 to rotate in a direction 142. The first interface portion 144 engages with the contact pads 24 on the printed circuit board 22. As the cartridge assembly 141 is retracted from the connector 120, the first compliant member 134 rotates the contact member 122 in a direction opposite to 142, causing the actuator 138 to rise from the housing 126.

Figure 6:
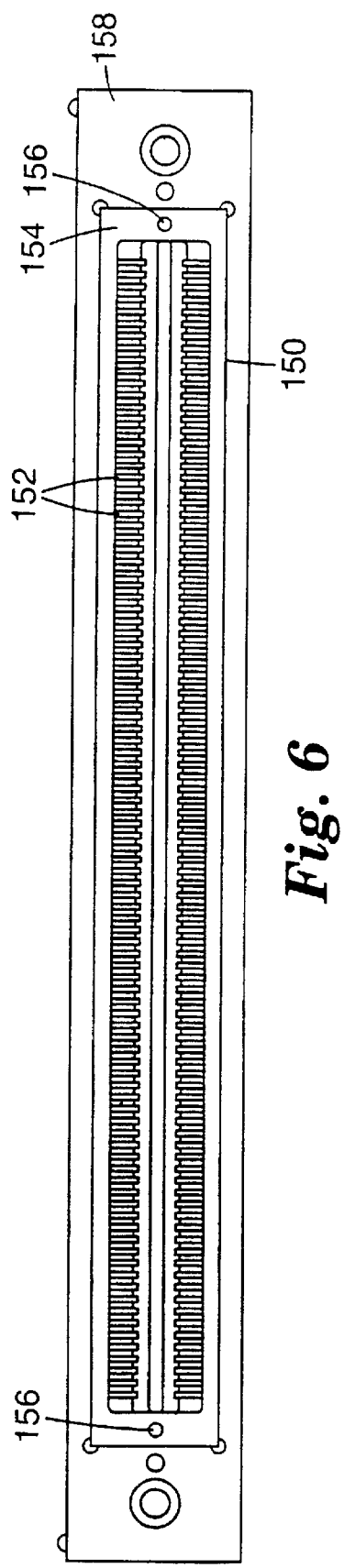
FIG. 6 is a top view of a removable contact set in accordance with the present invention.

FIG. 6 is a top view of a removable contact set 150 in accordance with the present invention. A plurality of contact members 152 are positioned in housing 154 in a two-dimensional array as discussed above. The housing 154 may include an aperture for each contact member 152 or multiple contact members 152 in larger apertures. Alignment pins 156 are provided on housing 154 for aligning the removable contacts at 150 with a base frame 158. The contact set 150 has a length corresponding to the length of the edge of the printed circuit board 22.

Figure 7:
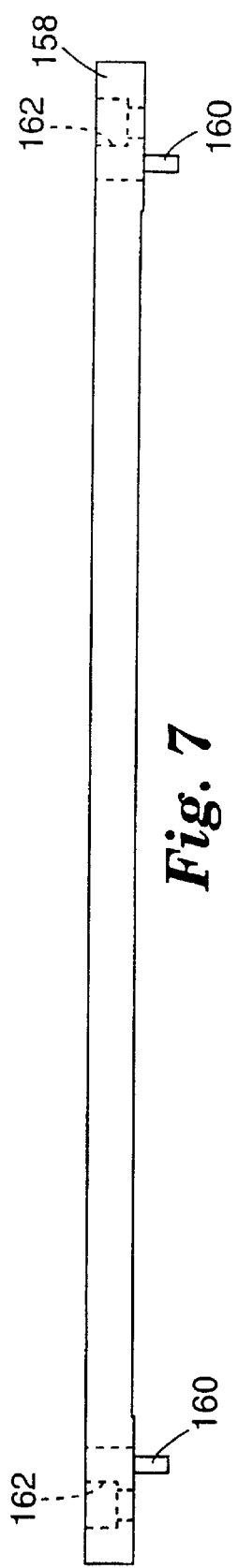
FIG. 7 is a side sectional view of a base frame for use with the contact set of FIG. 6.

FIG. 7 is a side view of the base frame 158 for positioning the contact set 150 on a second circuit member (not shown). The base frame 158 includes alignment pins 160 for engagement with the second circuit member. Mounting holes 162 are provided for optionally using fasteners for mounting the base frame 158 to the second circuit member. The suspended or removable contact set 150 may be removed and replace by lifting the housing 154 from the base frame 158.

Figure 8:
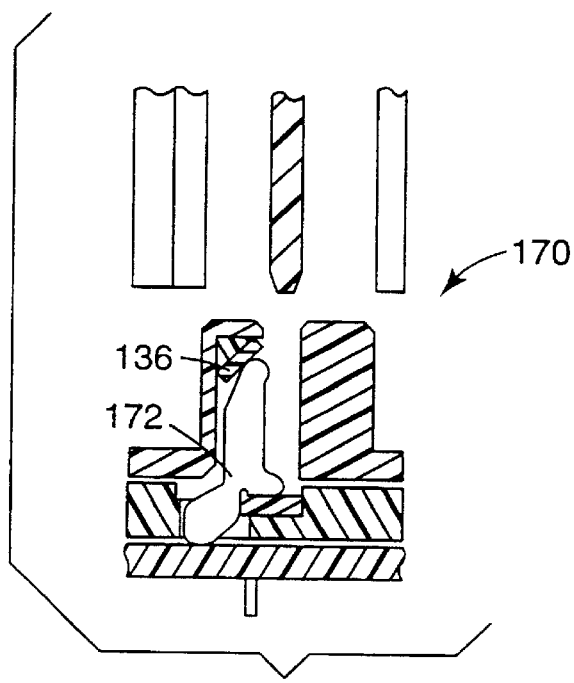
FIG. 8 is a side sectional view of an alternate connector in accordance with the present invention.
Figure 9:
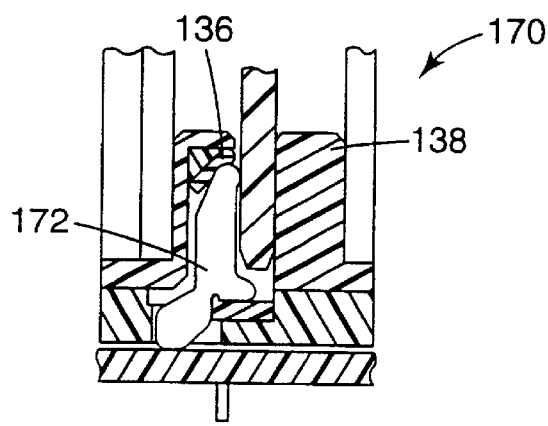
FIG. 9 is a side sectional view of the connector of FIG. 8 engaged with a printed circuit board.

FIGS. 8 and 9 illustrate an alternate connector 170 in accordance with the present invention. The connector 170 corresponds substantially to that shown in FIGS. 4 and 5, except that the contact member 172 is substantially longer. The second compliant material 136 is located adjacent to the upper edge of the actuator 138.

Figure 10:
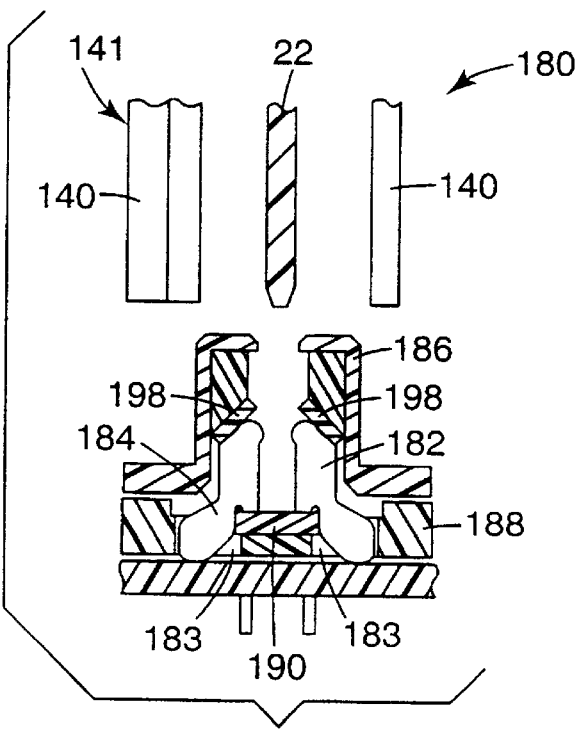
FIG. 10 is a side sectional view of a connector in accordance with the present invention.
Figure 11:
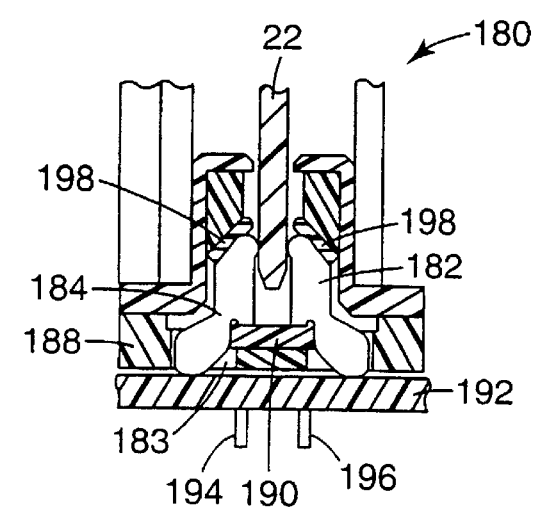
FIG. 11 is a side sectional view of the connector of FIG. 10 engaged with a printed circuit board.

FIGS. 10 and 11 are cross sectional views of an alternate connector 180 having a pair of opposing contact members 182, 184 positioned to engage both sides of the printed circuit board 22. Encapsulating material 183 retains the contact members 182, 184 in housing 188. The actuators 140 on the cartridge assembly 141 displace the actuator 186 and compliant members 198 towards the housing 188 to simultaneously rotate both contact members 182, 184 towards the printed circuit board 22 (see FIG. 11). In the illustrated embodiment, the compliant member 190 serves both contact members 182, 184. In an alternate embodiment, separate compliant members can be substituted for the unitary structure 190. Adapter 192 includes a pair of alignment pins 194, 196 that correspond to each of the contact members 182, 184, respectively.

Figure 12:
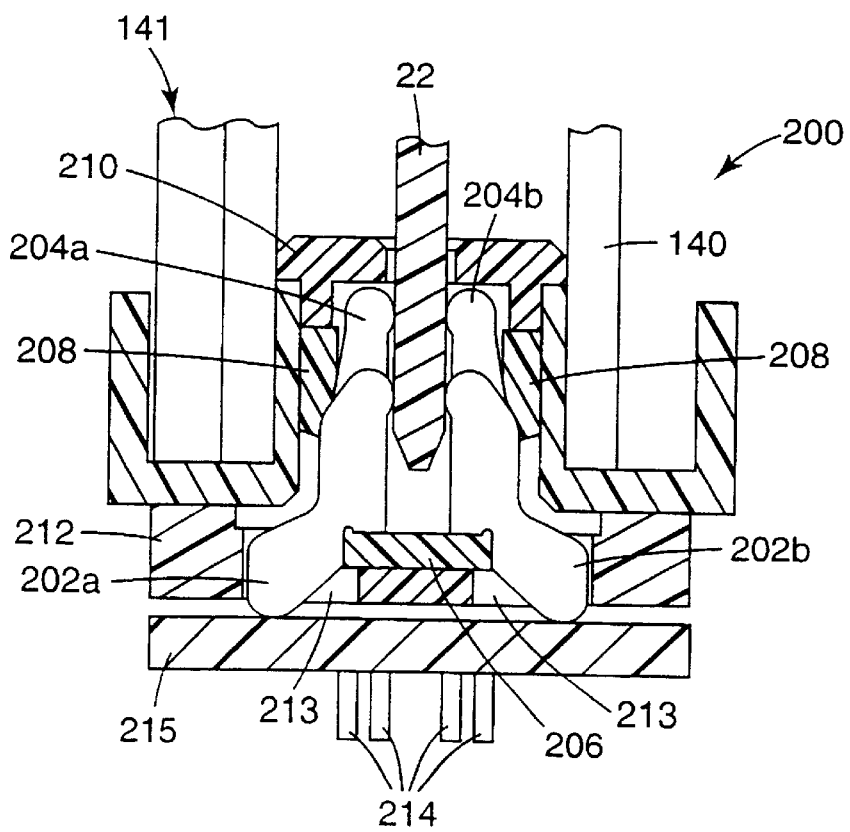
FIG. 12 is a side sectional view of a connector for engaging with multiple rows of conductive pads in accordance with the present invention.

FIG. 12 is an alternate connector 200 in accordance with the present invention in the engaged position. In the embodiment illustrated in FIG. 12, the printed circuit board 22 has multiple rows of conductive pads 24. Consequently, the connector 200 includes two rows of contact members 202a, 202b, 204a, and 204b retained in housing 212 by encapsulating material 213. Compliant member 206 biases the contact members away from the printed circuit board 22. As the cartridge assembly 141 advances towards the connector 200, the actuators 140 advance the actuator 210 towards the housing 212. Compliant member 208 works in conjunction with the actuator 210 to bias the contact members 202a, 202b, 204a, 204b towards the printed circuit board 22. In the illustrated embodiment, the number of alignment pins 214 on the adapter 215 corresponds with the number of contact members 202a, 202b, 204a, and 204b.

Figure 13:
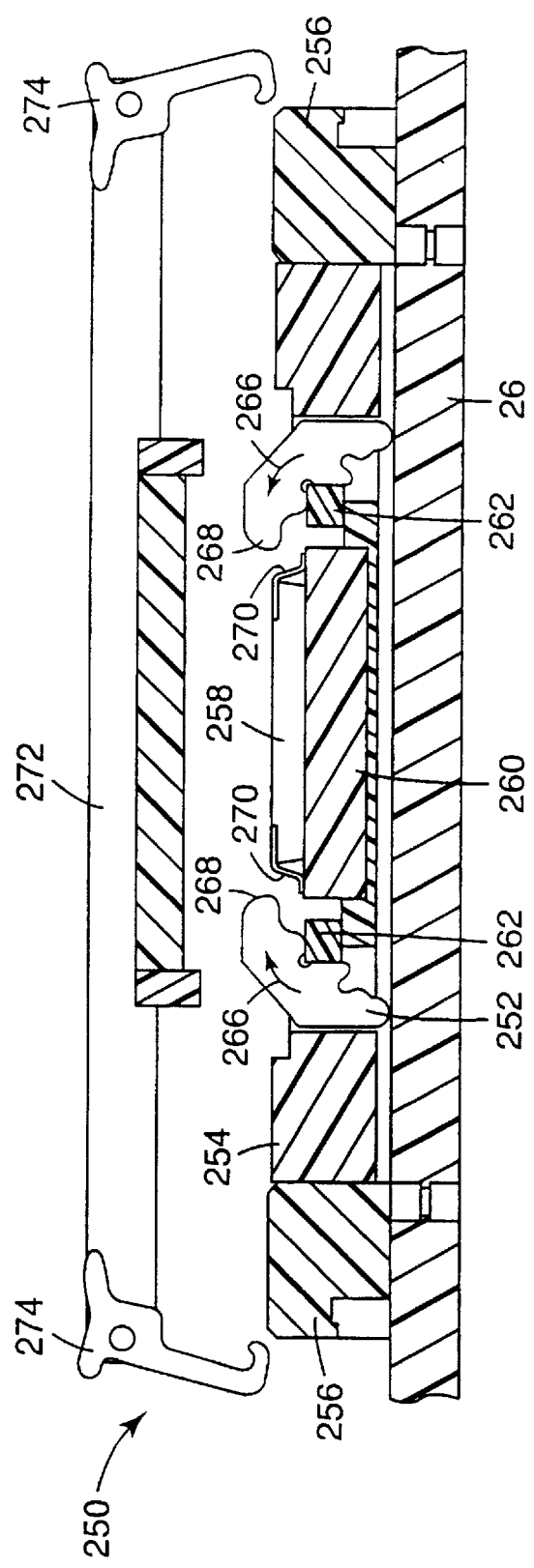
FIG. 13 is a side sectional view of an alternate connector for engaging an integrated circuit device with a printed circuit board in accordance with the present invention.
Figure 14:
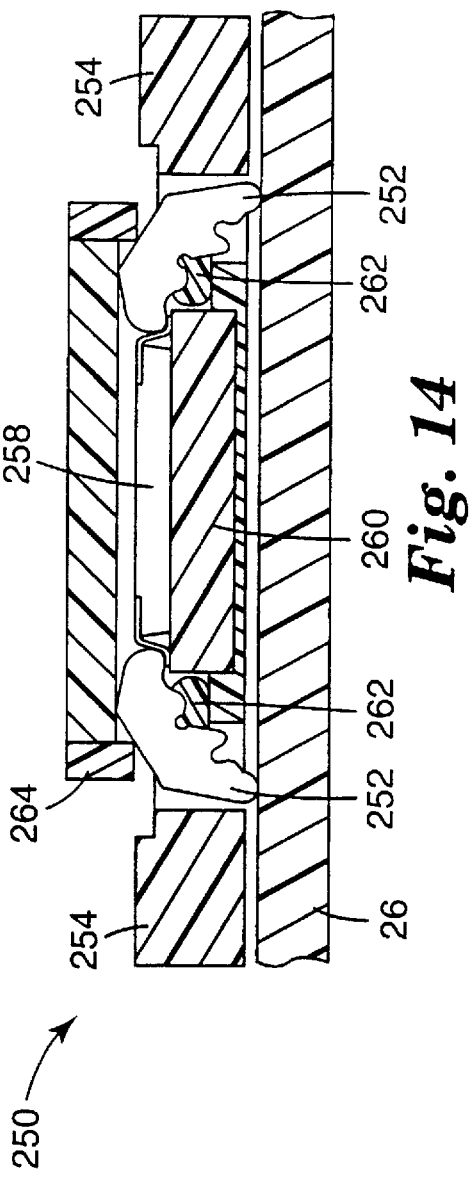
FIG. 14 is a side sectional view of the connector of FIG. 13 in the engaged configuration.

FIGS. 13 and 14 illustrate application of the present invention to a single integrated circuit device 258, such as a microprocessor. The connector 250 includes a series of contact members 252 positioned in housing 254. A base frame 256 locates the housing 254 on a second circuit member 26. The integrated circuit device 258 is positioned on a first compliant member 260 located within the housing 254. A second compliant member 262 biases the contact members 252 away from the device 258. An actuator 264 rotates the contact members 252 in a direction 266 so that the first interface portion 268 engages with the electrical leads 270 on the device 258. The actuator 264 can be constructed of a rigid, semi-rigid or compliant material. A cover 272 having a clamping structure 274 may optionally be provided for retaining the actuator 264 against the housing 254.

Figure 15:
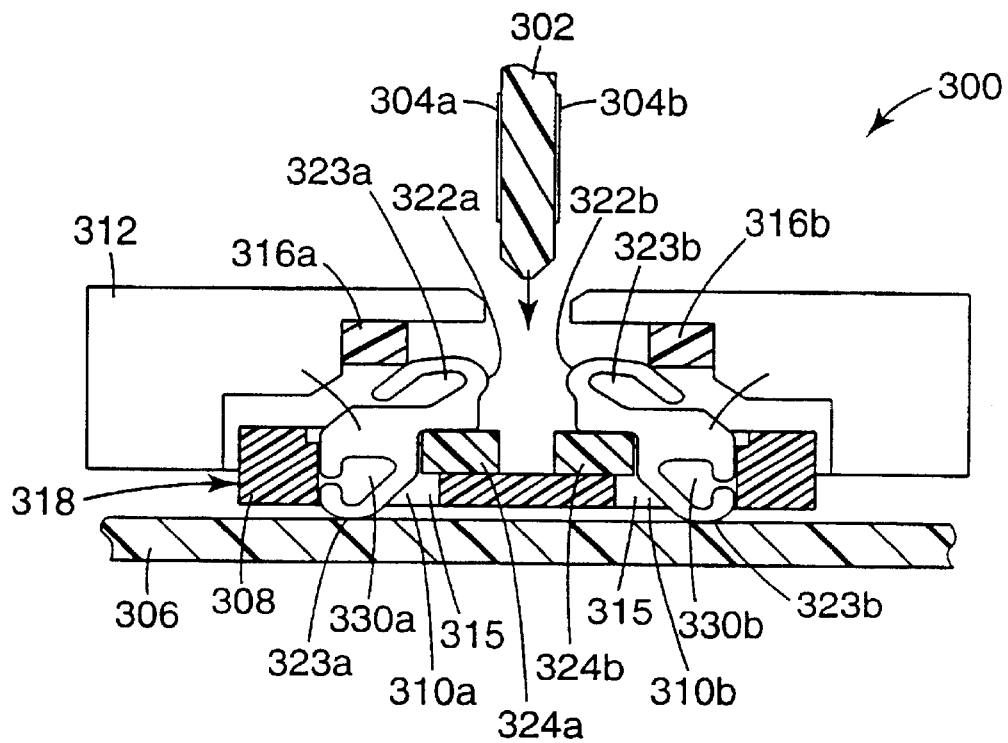
FIG. 15 is a side sectional view of an electrical connector with multiple modes of compliance in accordance with the present invention.
Figure 16:
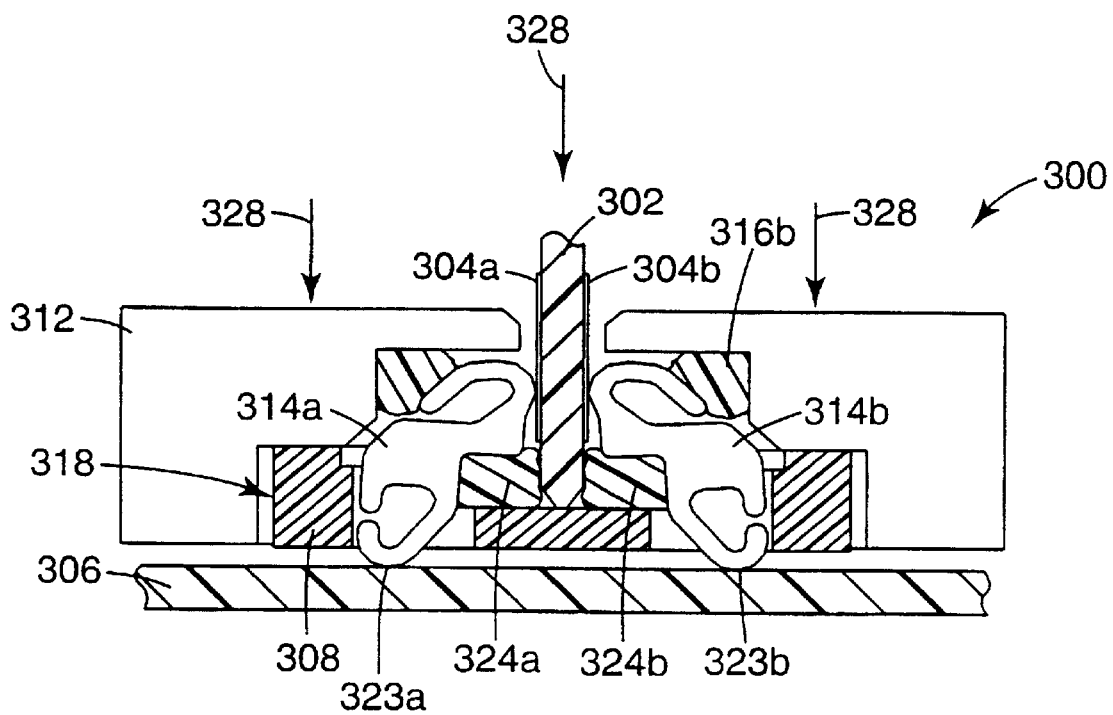
FIG. 16 is a side sectional view of the connector of FIG. 15 engaged with a printed circuit board.

FIGS. 15 and 16 are side sectional views of a connector 300 for electrically connecting a printed circuit board 302 have a plurality of conductive pads 304a, 304b with a second circuit member 306. The second circuit member 306 may be another printed circuit board, a motherboard, a back plane, or the like. The connector 300 includes a base frame 308 positioned on the second circuit member 306. The housing 308 has a pair of openings 310a, 310b configured to receive a plurality of contact members 314a, 314b (referred to collectively as "314"). The contact member 314 are flexible. A compliant encapsulating material 315 deposited in the openings 310a, 310b retain the contact members 314 in the housing 308. The housing 308 and contact members 314 form a contact set 318. Other housings for retaining the contact members 314 in a functional engagement with the printed circuit board 302 and second circuit member 306 are disclosed in U.S. Pat. No. 4,445,735 (Bonnefoy); U.S. Pat. No. 4,593,961 (Cosmo); U.S. Pat. No. 4,793,814 (Zifcat et al.); U.S. Pat. No. 5,061,192 (Chapin et al.); U.S. Pat. No. 5,096,426 (Simpson et al.); U.S. Pat. No. 5,913,687 (Rathbum); and U.S. Pat. No. 5,938,451 (Rathbum). Actuator 312 is positioned over the contact set 318 so that compliant materials 316a, 316b (referred to collectively as "316") engage with the contact members 314 when in the compressed configuration (see FIG. 16). Compliant materials 324a, 324b (referred to collectively as "324") support the contact members 314 in opposition to force 328 transmitted by compliant members 316a, 316, respectively.

The contact members 314a, 314b each have a first interface surface 322a, 322b positioned to engage with the contact pads 304a, 304b on the printed circuit board 302. Second interface surfaces 323a, 323b engage with the second circuit member 306. Cut outs 326a, 326b, 330a, 330b permit the respective contact members 31 4a, 31 4b to flex or elastically deform under force 328 provided by the actuator 312 (see FIG. 16).

As the actuator 312 is advanced toward the contact set 318 under the force 328, the contact members 314 can translate and/or rotate within the openings 310a, 310b. Initial compression of the contact set 318 results in movement of the contact members 314 that is induced by the co-planarity differential of the device or terminals on the printed circuit board 302 and/or second circuit member 306. The design of the contact members 314 and the associated housing 308 determines the duration and extent of deflection in this first mode. The first mode of compliance is primarily determined by the resiliency of the compliant material 316, 324, although some elastic deformation of the contact members 314 is possible.

Figure 17:
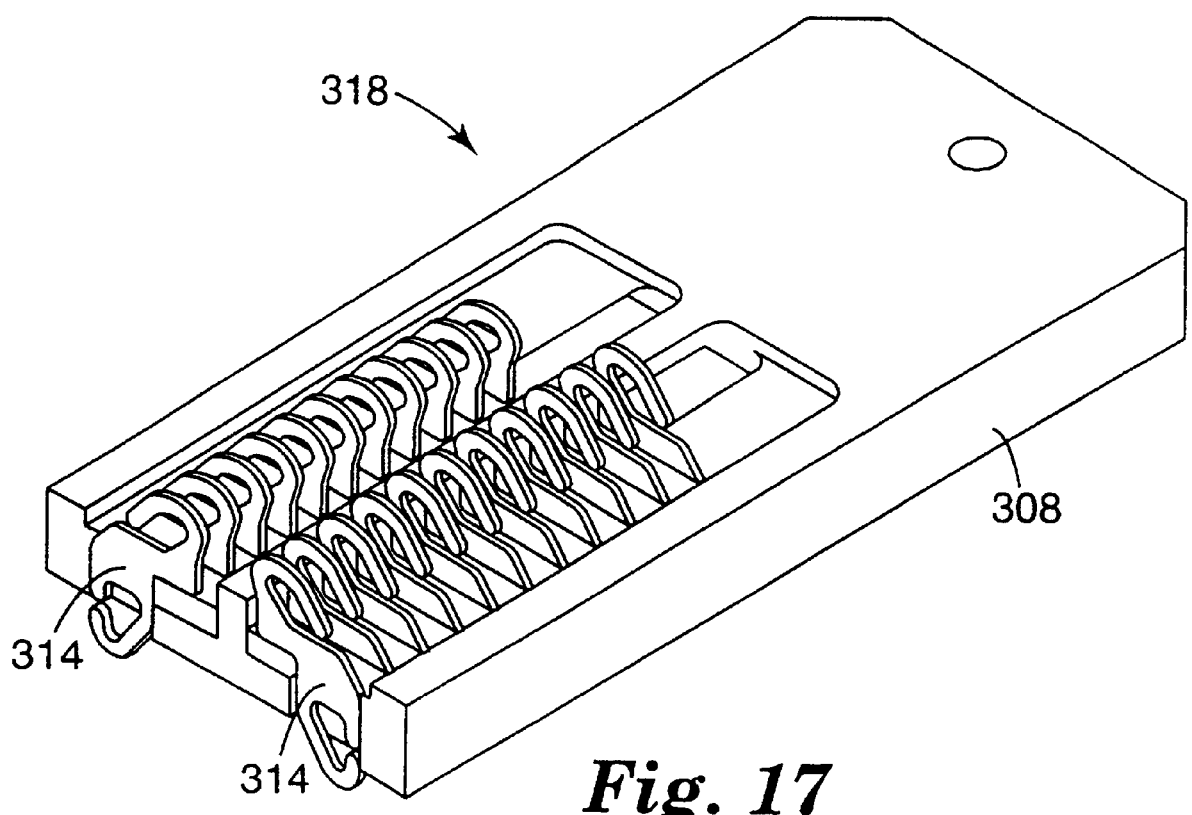
FIG. 17 is a perspective view of an electrical connector with multiple modes of compliance in accordance with the present invention.

As the compression proceeds, the contact members 314 supported by the compliant material 316, 324 encounter the contact pads 304 on the printed circuit board 302. The second interface portions 323a, 323b are also firmly engaged with the second circuit member 306. The compliant material 316, 324 is substantially compressed within its elastic limit. Once the compliant materials 316, 324 are substantially compressed, these locations provide flexure points for elastic bending of the contact members 314. Continued compression by the actuator 312 induces elastic bending of the contact members 314 in the second mode of compliance, typically in the region around the cutouts 326, 330. The second mode of compliance may include continued compression of compliant material 316, 324, elastic deformation of the contact members 314 around the cutouts 326, 330, and/or a combination thereof. FIG. 17 is a perspective sectional view of the contact set 318 of FIG. 16 having an array of flexible contact members 314 retained in housing 308.

Figure 18:
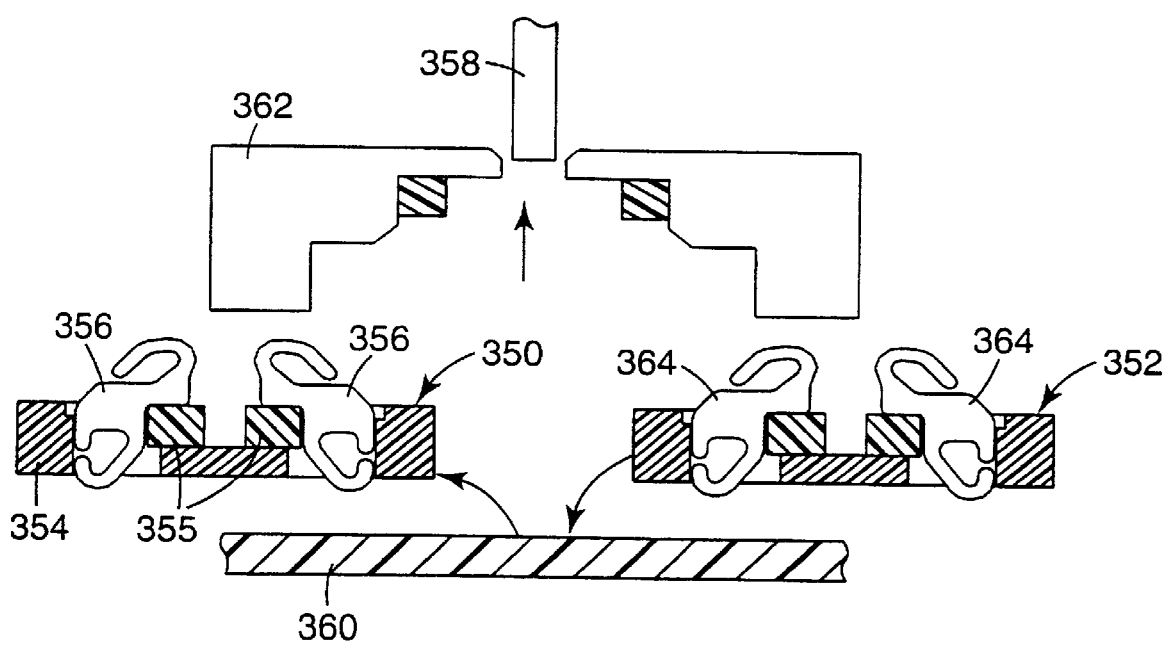
FIG. 18 is a schematic illustration of a method of replacing a contact set in accordance with the present invention.

FIG. 18 is a schematic illustration of a method of replacing a first contact set 350 for a second contact set 352. The contact set 350, including housing 354, compliant material 355, and contact members 356 is a self-supporting, discrete component that can be positioned for electrically coupling a printed circuit board 358 to a second circuit member 360. Although contact member 356 are illustrated as flexible, any of the contact sets disclosed herein can be used with the method of FIG. 18.

Actuator 362 provides the driving force for compressing the contact members 356 into electric engagement with the printed circuit board 358. If the contact set 350 is damaged or otherwise fails to operate correctly, the actuator 362 can be removed to release the printed circuit board 358. The contact set 350 is then removed from the second circuit member 360. The second contact set 352 is than positioned on the second circuit member 360. Once the printed circuit board 358 is positioned within the contact set 352, the actuator 362 is replace so that contact members 364 electrically couple with the printed circuit board 358.

Figure 19:
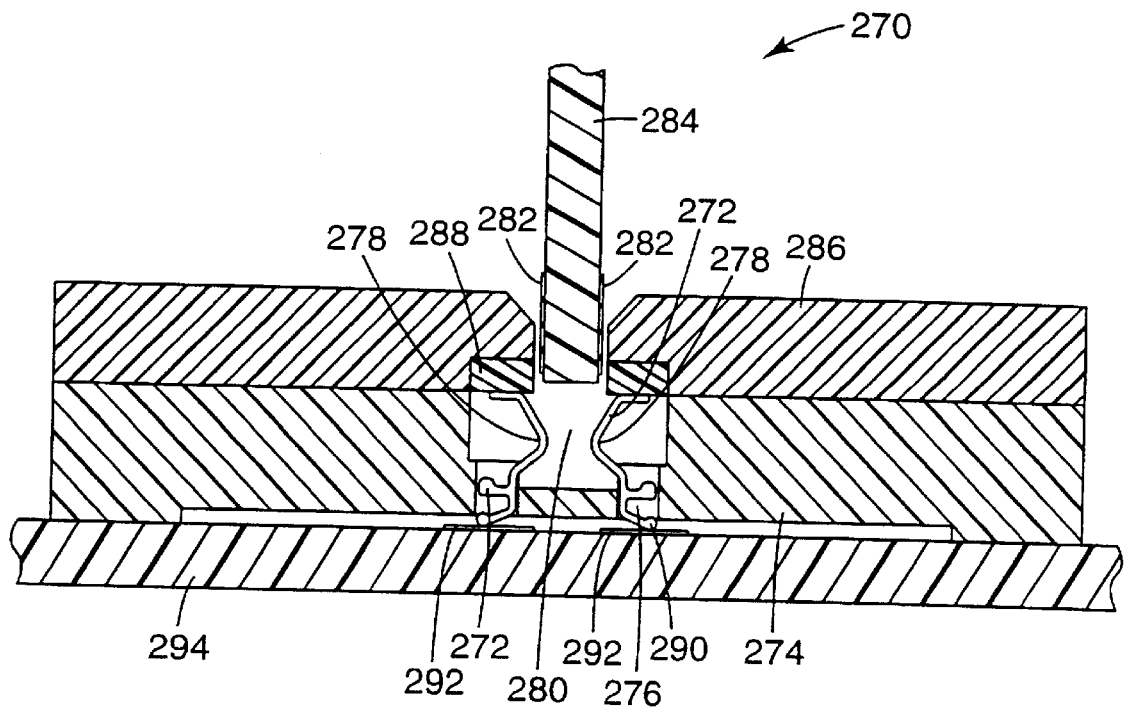
FIG. 19 is a side sectional view of an alternate electrical connector with multiple modes of compliance in accordance with the present invention.

FIG. 19 is a side sectional view of an alternate electrical connector 270 with multiple modes of compliance in accordance with the present invention. Contact members 272 are retained in housing 274 by encapsulating material 276. In the illustrated embodiment, the contact member 272 are positioned in the housing 274 so that first interface surfaces 278 extend into opening 280. That is, the contact members 272 are preloaded for engagement with contact pads 282 on first circuit member 284, typically a printed circuit board. Actuator 286 includes compliant members 288 acting on contact members 272. Second interface surface 290 on the contact members 272 is engaged with contact pads 292 on the second circuit member 294.

As first circuit member 284 is inserted, rotation and/or translation of the contact members 272 in a first mode of compliance is primarily due to resistance by the encapsulating material 276 and the compliant member 288. The contact members 272 experience minimal or no bending. At some point, further deflection of the contact member 272 results in elastic bending of the contact members 272 in a second mode of compliance. Although the second mode of compliance is primarily due to elastic bending of the contact members 272, the resiliency of the materials 276, 288 may also be a factor.

Figure 20:
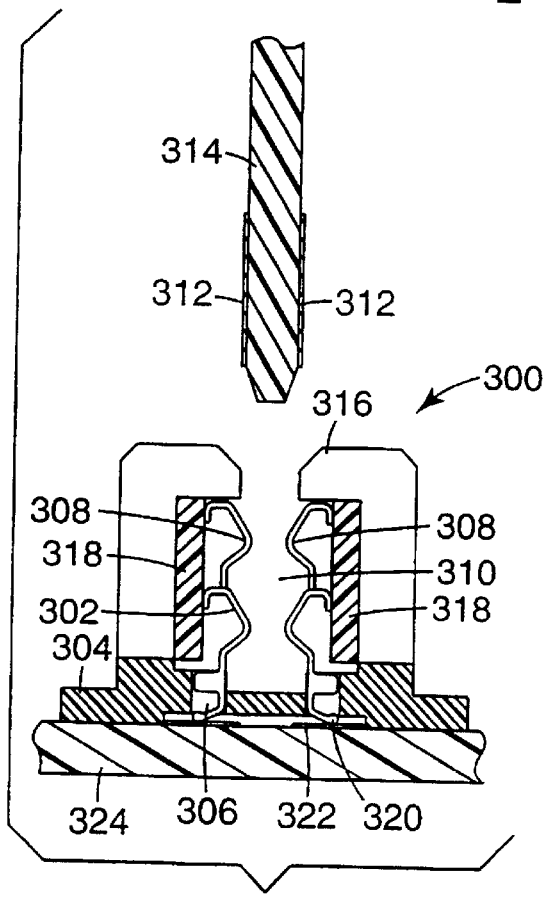
FIG. 20 is a side sectional view of an alternate electrical connector with multiple modes of compliance in accordance with the present invention.
Figure 21:
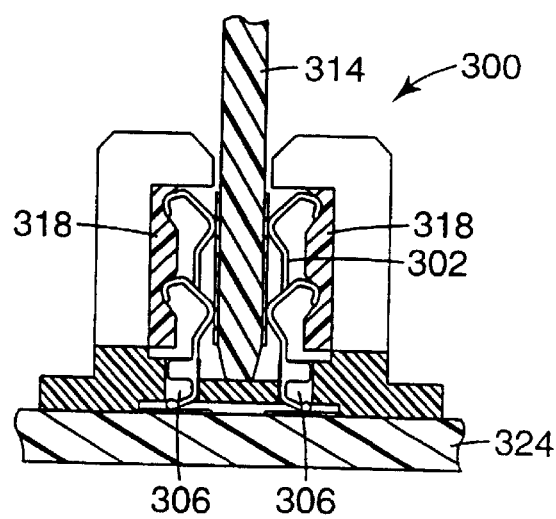
FIG. 21 is a side sectional view of the connector of FIG. 20 engaged with a printed circuit board.

FIGS. 20 and 21 are side sectional views of an alternate electrical connector 300 with multiple modes of compliance in accordance with the present invention. Contact members 302 are retained in housing 304 by encapsulating material 306. In the illustrated embodiment, the contact member 302 are positioned in the housing 304 so that first interface surfaces 308 extend into opening 310. That is, the contact members 302 are preloaded for engagement with contact pads 312 on first circuit member 314, typically a printed circuit board. Actuator 316 includes compliant members 318 acting on contact members 302. Second interface surface 320 on the contact members 302 is engaged with contact pads 322 on the second circuit member 324.

As first circuit member 314 is inserted, rotation and/or translation of the contact members 302 in a first mode of compliance is primarily resisted by the resiliency of the encapsulating material 306 and the compliant member 318. The contact members 302 experience minimal or no bending. At some point, further deflection of the contact member 302 results in elastic bending of the contact members 302 in a second mode of compliance. Although the second mode of compliance is primarily elastic bending of the contact members 302, the resiliency of the materials 306, 318 may also be a factor.

The embodiments disclosed herein are basic guidelines, and are not to be considered exhaustive or indicative of the only methods of practicing the present invention. There are many styles and combinations of properties possible, with only a few illustrated. Each connector application must be defined with respect to deflection, use, cost, force, assembly, & tooling considered.

Patents and patent applications disclosed herein, including those cited in the background of the invention, are hereby incorporated by reference. Other embodiments of the invention are possible. It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A connector apparatus for electrically connecting a first circuit member having a plurality of conductive pads to a second circuit member comprising:
    a connector housing having a receiving opening and one or more apertures releasably positionable opposite the second circuit member;
    one or more contact members positioned within each of the apertures, each contact member having a first interface portion adjacent to the receiving opening, the receiving opening being adapted to receive the first circuit member, and a second interface portion positioned to engage with the second circuit member, the contact members being moveable between an engaged position and a disengaged position;
    a first compliant encapsulating material retaining the contact members to the connector housing;
    a second compliant elastomeric material positioned to bias the contact members toward the engaged position, such that a portion of the first interface portion is biased toward the receiving opening when the contact member is moved from the disengaged position to the engaged position; and
    an actuator adapted to bias a portion of the contact members against the housing and to bias the first interface portion toward the engaged position, wherein the contact members in the disengaged position provide minimal resistance to insertion of the first circuit member into the receiving opening.

2. The apparatus of claim 1 wherein the contact members in the disengaged position provide no resistance to insertion of a first circuit member into the receiving opening.

3. The apparatus of claim 1 wherein the contact members abut the connector housing in the disengaged position.

4. The apparatus of claim 1 wherein the contact members are biased against the connector housing when moving from the disengaged position to the engaged position.

5. The apparatus of claim 1 wherein the actuator includes an opening permitting a first circuit member to extend into the receiving opening.

6. The apparatus of claim 1 wherein the first compliant encapsulating material is positioned between the contact members and the connector housing and a second compliant elastomeric material is positioned between the contact members and the actuator.

7. The apparatus of claim 6 wherein first compliant encapsulating material has a Durometer greater than, less than, or equal to, a Durometer of the second compliant elastomeric material.

8. The apparatus of claim 1 wherein the contact members comprise one or more recesses for receiving a portion of the first compliant encapsulating material.

9. The apparatus of claim 1 wherein the contact members comprise one of flexible contact members or rigid contact members.

10. The apparatus of claim 1 wherein the contact members are flexible such that when in the engaged position resiliency of the first and second compliant members comprises a first mode of compliance and elastic deformation of the flexible contact members comprises a second mode of compliance.

11. The apparatus of claim 1 further comprising a base frame attachable to a second circuit member.

12. The apparatus of claim 1 wherein the receiving opening comprises a support structure opposite the first interface portions.

13. The apparatus of claim 1 wherein at least two of the contact members positioned within the aperture to engage with opposite sides of the first circuit member.

14. The apparatus of claim 1 wherein the actuator is engaged with the housing in response to a first circuit member being inserted into the receiving opening.

15. The apparatus of claim 1 wherein the first circuit interface portion comprises a shape complementary to a shape of an electrical interface on a first circuit member.

16. The apparatus of claim 1 further comprising at least one support member supporting the contact member.

17. The apparatus of claim 16 wherein the support member comprises a pivot point around which the contact members rotate.

18. The apparatus of claim 1 further comprising an adapter interposed between the connector apparatus and a second circuit member.

19. The apparatus of claim 18 wherein the adapter comprises:
    a plurality of adapter conductive pads arranged to electrically couple with the second interface portions of the contact members; and
    a plurality of alignment pins electrically coupled to the adapter conductive pads and arranged to electrically couple with the second printed circuit board.

20. The apparatus of claim 1 wherein the connector housing, contact members and first compliant encapsulating material comprise a removable contact set.

21. The apparatus of claim 1 wherein the second compliant elastomeric material is attached to the actuator.

22. A connector apparatus for electrically connecting a first circuit member having a plurality of conductive pads to a second circuit member, comprising:
    a connector housing having a receiving opening and one or more apertures releasably positionable opposite the second circuit member;

one or more contact members positioned within each of the apertures, at least two of the contact members positioned to engage with opposite sides of the first circuit member, each contact member having a first interface portion adjacent to the receiving opening, the receiving opening being adapted to receive said first circuit member, and a second interface portion positioned to engage with the second circuit member, the contact members being moveable between an engaged and a disengaged position, at least two of the contact members positioned within the aperture to engage with opposite sides of the first circuit member;

a first compliant encapsulating material retaining the contact members to the connector housing; and a second compliant elastomeric material positioned to bias the contact members toward the engaged position such that a portion of the first interface portion is biased toward the receiving opening when the contact member is moved from the disengaged position to the engaged position and the contact members in the disengaged position provide minimal resistance to insertion of the first circuit member into the receiving opening.

23. The apparatus of claim 22 wherein the receiving opening comprises a width greater than a thickness of a first circuit member when the contact members are in the disengaged position.

24. The apparatus of claim 22 wherein a portion of the contact members are biased against the connector housing when moving from the disengaged position to the engaged position.

25. A method of electrically connecting a first circuit member to a second circuit member using a connector apparatus, comprising:

a connector housing having a receiving opening and one or more apertures releasably positionable opposite the second circuit member;

one or more contact members positioned within each of the apertures, each contact member having a first interface portion adjacent to the receiving opening, the receiving opening being adapted to receive the first circuit member, and a second interface portion positioned to engage with the second circuit member, the contact members being movable between an engaged and a disengaged position;

a first compliant encapsulating material retaining the contact members to the connector housing;

a second compliant elastomeric material positioned to bias the contact members toward the engaged position, such that a portion of the first interface portion is biased toward the receiving opening when the contact member is moved from the disengaged position to the engaged position; and an actuator adapted to bias a portion of the contact members against the housing and to bias the first interface portion toward the engaged position; the method comprising the steps of:

locating the connector housing on the second circuit member;

inserting the first circuit member into the receiving opening; and engaging the actuator with the housing to bias the contact members toward the engaged position, wherein the contact members in the disengaged position provide minimal resistance to insertion of the first circuit member into the receiving opening.

26. A method of electrically connecting a first circuit member to a second circuit member using a connector apparatus, comprising:

a connector housing having a receiving opening and one or more apertures releasably positionable opposite the second circuit member;

one or more contact members positioned within each of the apertures, each contact member having a first interface portion adjacent to the receiving opening, the receiving opening being adapted to receive the first circuit member, and a second interface portion positioned to engage with the second circuit member, the contact members being movable between an engaged and a disengaged position;

a first compliant encapsulating material retaining the contact members to the connector housing;

a second compliant elastomeric material positioned to bias the contact members toward the engaged position, such that a portion of the first interface portion is biased toward the receiving opening when the contact member is moved from the disengaged position to the engaged position; the method comprising the steps of:

locating the connector housing on the second circuit member, and inserting the first circuit member into the receiving opening, wherein the contact members in the disengaged position provide minimal resistance to insertion of the first circuit member into the receiving opening.

27. A connector apparatus for electrically connecting of a first circuit member having a plurality of conductive pads to a second circuit member comprising:

a connector housing having a receiving opening and one or more apertures releasably positionable opposite the second circuit member;

one or more contact members positioned within each of the apertures, each contact member having a first interface portion adjacent to the receiving opening, the receiving opening being adapted to receive the first circuit member, and a second interface portion positioned to engage with the second circuit member, the contact members being moveable between an engaged position and a disengaged position;

a first compliant encapsulating material positioned between the contact members and the connector housing;

a second compliant elastomeric material positioned between the contact members and an actuator; and an actuator adapted to bias a portion of the contact members against the housing and to bias the first interface portion toward the receiving opening when the contact member is moved from the disengaged position to the engaged position.

28. A connector apparatus for electrically connecting of a first circuit member having a plurality of conductive pads to a second circuit member comprising:

a connector housing having a receiving opening and one or more apertures releasably positionable opposite the second circuit member;

at least two contact members positioned in the apertures to engage with opposite sides of the first circuit member, each contact member having a first interface portion adjacent to the receiving opening, the receiving opening being adapted to receive the first circuit member, and a second interface portion positioned to engage with the second circuit member, the contact members being moveable between an engaged position and a disengaged position;

a first compliant encapsulating material retaining the contact members to the connector housing;

a second compliant elastomeric material positioned to bias the contact members toward the engaged position, such that a portion of the first interface portion is biased toward the receiving opening when the contact member is moved from the disengaged position to the engaged position; and an actuator adapted to bias a portion of the contact members against the housing and to bias the first interface portion toward the receiving opening when the contact member is moved from the disengaged position to the engaged position.

29. The apparatus of claim 22 wherein the contact members in the disengaged position provide no resistance to insertion of a first circuit member into the receiving opening.

30. The apparatus of claim 22 wherein the contact members abut the connector housing in the disengaged position.

31. The apparatus of claim 22 wherein the contact members are biased against the connector housing when moving from the disengaged position to the engaged position.

32. The apparatus of claim 22 wherein first compliant encapsulating material has a Durometer greater than, less than, or equal to, a Durometer of the second compliant elastomeric material.

33. The apparatus of claim 22 wherein the contact members comprise one or more recesses for receiving a portion of the first compliant encapsulating material.

34. The apparatus of claim 22 wherein the contact members comprise one of flexible contact members or rigid contact members.

35. The apparatus of claim 22 wherein the contact members are flexible such that when in the engaged position resiliency of the first and second compliant members comprises a first mode of compliance and elastic deformation of the flexible contact members comprises a second mode of compliance.

36. The apparatus of claim 22 further comprising a base frame attachable to a second circuit member.

37. The apparatus of claim 22 wherein the receiving opening comprises a support structure opposite the first interface portions.

38. The apparatus of clam 22 wherein the first circuit interface portion comprises a shape complementary to a shape of an electrical interface on a first circuit member.

39. The apparatus of claim 22 wherein the support member comprises a pivot point around which the contact members rotate.

40. The apparatus of claim 22 further comprising an adapter interposed between the connector apparatus and a second circuit member.

41. The apparatus of claim 22 wherein the connector housing, contact members and first compliant encapsulating material comprise a removable contact set.

* * * * *

UNITED STATES PATENT AND TRADEMARK OFFICE
CERTIFICATE OF CORRECTION

PATENT NO.    : 6,572,396 B1
DATED         : June 3, 2003
INVENTOR(S)   : James J. Rathburn Page 1 of 1

It is certified that error appears in the above-identified patent and that said Letters Patent is hereby corrected as shown below:

<u>Column 16,</u>
Add Claim 42 as follows:

42.   The method of claim 26 comprising the step of inserting the first circuit member into the receiving opening after the actuator is engaged with the housing.

Signed and Sealed this

Thirteenth Day of January, 2004

JON W. DUDAS
*Acting Director of the United States Patent and Trademark Office*